US008649428B2

(12) United States Patent  
Villion et al.

(10) Patent No.: US 8,649,428 B2  
(45) Date of Patent: Feb. 11, 2014

(54) METHOD AND APPARATUS FOR DECODING RECEIVED DATA SIGNALS

(75) Inventors: Mathieu Villion, Toulouse (FR); Laurence Poirier-Clarac, Toulouse (FR); Pierre Tardy, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 558 days.

(21) Appl. No.: 12/866,244

(22) PCT Filed: Feb. 11, 2008

(86) PCT No.: PCT/IB2008/051777  
§ 371 (c)(1),  
(2), (4) Date: Aug. 5, 2010

(87) PCT Pub. No.: WO2009/101485  
PCT Pub. Date: Aug. 20, 2009

(65) Prior Publication Data  
US 2010/0316117 A1 Dec. 16, 2010

(51) Int. Cl.  
*H04N 11/04* (2006.01)

(52) U.S. Cl.  
USPC .............................. 375/240.01; 375/E07.026

(58) Field of Classification Search  
None  
See application file for complete search history.

(56) References Cited

U.S. PATENT DOCUMENTS

| | | |
|---|---|---|
| 6,608,828 B1 | 8/2003 | Balachandran |
| 2004/0194005 A1* | 9/2004 | Huggett ........................ 714/795 |

FOREIGN PATENT DOCUMENTS

| | | |
|---|---|---|
| EP | 1533930 A1 | 5/2005 |
| WO | 2007/021224 A | 2/2007 |
| WO | WO-2007/021224 * | 2/2007 |

OTHER PUBLICATIONS

Digital Video Broadcasting (DVB); Framing Structure, Channel Coding and Modulation for Digital Terrestrial Television; ETSI EN 300 744 ETSI Standards, LIS, Sophia Antipolis, Cedex, France, vol. BC, No. V1.5.1, Nov. 1, 2004.*

"Digital Video Broadcasting (DVB); Framing Structure, Channel Coding and Modulation for Digital Terrestrial Television; ETSI EN 300 744" ETSI Standards, LIS, Sophia Antipolis, Cedex, France, vol. BC, No. V1.5.1, Nov. 1, 2004.

International Search Report and Written Opinion correlating to PCT/IB2008/051777 dated Feb. 11, 2008.

* cited by examiner

*Primary Examiner* — Andy Rao  
*Assistant Examiner* — Tyler Edwards

(57) ABSTRACT

Decoding logic is arranged to receive an encoded data signal. The decoding logic comprises a convolutional decoder arranged to perform convolutional decoding on the encoded data signal, to produce a decoded data signal. The decoding logic comprises header bit prediction logic arranged to predict a value for at least one header bit within the decoded data signal, and to provide the predicted value for the at least one header bit to the convolutional decoder to be applied during convolutional decoding.

18 Claims, 6 Drawing Sheets

| Field | No. Of Bits | Values |
|---|---|---|
| sync_byte | 8 | 0x47 |
| transport_error_indicator | 1 | 0 |
| payload_unit_start_indicator | 1 | 0/1 |
| transport_priority | 1 | 0/1 |
| PID | 13 | - |
| transport_scrambling_control | 2 | 0-3 |
| adaptation_field_control | 2 | 0-3 |
| continuity_counter | 4 | 0-15 |

FIG. 5

METHOD AND APPARATUS FOR DECODING RECEIVED DATA SIGNALS

FIELD OF THE INVENTION

The field of the invention relates to a method and apparatus for decoding received data signals, and in particular to a method and apparatus for decoding received MPEG-2 transport stream signals.

BACKGROUND OF THE INVENTION

Present day data communication networks, both wireless and wire-line, have a requirement to transfer data between communication units. Data, in this context, includes many forms of communication, such as speech, multimedia, signalling, etc. Typically, such data communication needs to be effectively and efficiently transported, in order to optimise use of limited communication resources.

Due to the recent growth in communications, particularly in Internet and wireless communications, there exists a need to provide improved data transfer techniques, where a particular quality of service of the transmitted data is often required or desired by the end user.

The European Telecommunication Standards Institute (ETSI) has defined a number of communication standards with the aim that a number of manufacturers are able to provide equipment that supports the same technology and notably are able to inter-operate with other equipment compliant with that standard. One such data communication standard developed by ETSI is the Terrestrial Digital Video Broadcasting (DVB-T) standard (ETSI EN 300 744), which has been developed for digital television sets and set-top boxes.

A recent variation of the DVB-T standard that has been adopted to incorporate enhanced features to allow improved reception of digital video broadcasting services for mobile devices is the digital video broadcasting—handset DVB-H standard. A DVB-H unit is battery powered, and the nature of the broadcast transmission offers a possibility to the DVB-H unit to repeatedly power off components/circuits of the DVB-H unit's receiver chain to increase battery life. It is anticipated that DVB-H units may receive transmissions at a variety of locations, such as: indoor, outdoor, as a pedestrian, within a moving vehicle, etc.

Historically, DVB-T was targeted for MPEG-2 video to be transmitted in MPEG-2 Transport Steams (TS), with the MPEG-2 TS protected with Reed Solomon (RS) Forward Error Correction (FEC) codes. To cope with mobile propagation degradation, DVB-H introduced another layer of RS FEC called multi-protocol encapsulation (MPE)-FEC. Here, only MPE blocks with correct cyclic redundancy check (CRC) are further processed by the MPE FEC decoder. If the CRC fails, the whole block is discarded. Zeros are then inserted at the proper byte positions in the RS code words, instead of the block data, and are marked as "unreliable". If there are more than 64-unreliable byte positions in an RS code word, the RS decoder cannot correct anything, and therefore just outputs the bytes without error correction.

Referring now to FIG. 1, there is illustrated an example of part of a known decoder 100 for decoding received DVB-T (or similar) signals. The decoder 100 comprises an inner decoder 110 and an outer decoder 120 for decoding the received demodulated signal. As is known in the art, the inner decoder is a convolutional decoder, in which the reception is typically implemented using a soft-decision Viterbi decoder. This reduces the effect of thermal noise and interference on the quality of the received signal, as Viterbi errors are generally bursty in nature. A Reed-Solomon decoder is used as the outer decoder, which feeds the decoded signal into a descrambler 130, which descrambles the received data packets, which are then output, for the illustrated example, in the form of MPEG-2 transport multiplex (MUX) packets.

Transmitted data is scrambled in order to ensure adequate binary transitions for the purpose of energy dispersal. A pseudo random binary sequence (PRBS) is used to scramble MPEG-2 transport multiplex packets. A synchronisation (sync) byte is then added to the front of each scrambled packet. The sync byte of the first packet in each group of eight packets is bit wise inverted to provide an initialisation signal for the descrambler. In this manner, each time a packet comprising an inverted sync byte is received, typically every $8^{th}$ packet in a stream, the descrambler reinitialises the PRBS.

Accordingly, for the example illustrated in FIG. 1, after decoding the received data, the outer decoder 120 passes decoded sync bytes to synchronisation logic 140, which detects inverted sync bytes, and signals the descrambler when to reinitialise the PRBS, for example by way of a modulo 8 index signal.

The MPEG-2 transport MUX packets are then passed to a de-multiplexer (not shown), which de-multiplexes each MPEG-2 transport MUX packet, to separate out the individual services encapsulated therein. A problem with MPEG-2 transport MUX packets is that information required to de-multiplex each packet is located within the header section of that packet. As a result, if errors occur within the header section during transportation of the MPEG-2 transport MUX packet from its source to its destination, it may not be possible to de-multiplex the packet. Consequently, the packet will be discarded, losing all the data carried therein, even if the data itself is intact and/or useful.

As will be appreciated by a skilled artisan, although it is possible to add redundancy and additional forms of forward error correction and the like to the transmission of data signals, the addition of such redundancy etc. means that such transmissions no longer conform to existing standards, and thus introduces compatibility issues.

SUMMARY OF THE INVENTION

In accordance with aspects of the invention, there is provided decoder, a semiconductor device comprising decoder and a method for decoding a received data signal as defined in the appended Claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

FIG. 5 illustrates typical fields within the header section of an MPEG-2 transport stream data packet.

DESCRIPTION OF EMBODIMENTS

Embodiments of the invention will be described in terms of a system-on-chip (SoC) comprising decoding logic. Although embodiments of the invention will be described in terms of a system-on-chip (SoC) that is capable of decoding MPEG-2 TS signals, it will be appreciated that the embodiments herein described may be applied in any apparatus that performs convolutional decoding of received data signals.

Embodiments of the invention will be described in terms of a method and apparatus for decoding MPEG-2 Transport Stream (TS) signals. MPEG-2 is a standard for the generic coding of moving pictures and associated audio information, developed by the Moving Pictures Expert Group (MPEG), and defined in International Standard ISO/IEC 13818.

A method and apparatus is proposed for decoding a received data signal. In particular, one aspect of the invention comprises decoder arranged to receive an encoded data signal and to perform decoding on the encoded data signal to produce a decoded data signal. The decoder comprises a forward error correction decoder arranged to perform forward error correction decoding on the encoded data signal. The decoder further comprises header bit prediction logic arranged to predict a value for at least one header bit within the decoded data signal, and to provide the predicted value for the (or each of) at least one header bit(s) to the forward error correction decoder to apply the predicted value for the (or each of) at least one header bit(s) during the convolutional decoding. In the following, examples are described in which the forward error correction decoder is a convolutional decoder for performing a convolutional decoding. However, the forward error correction decoder may be of another type, such as a block decoder or a turbo decoder.

Figure 1:
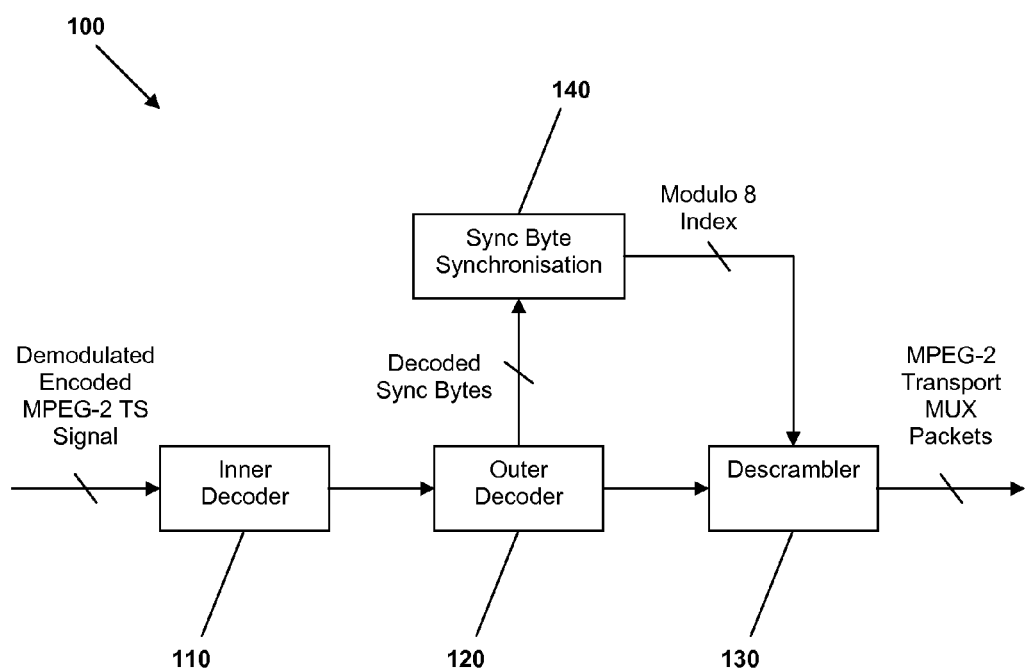
FIG. 1 illustrates an example of part of a known decoder for decoding received DVB-T signals.
Figure 2:
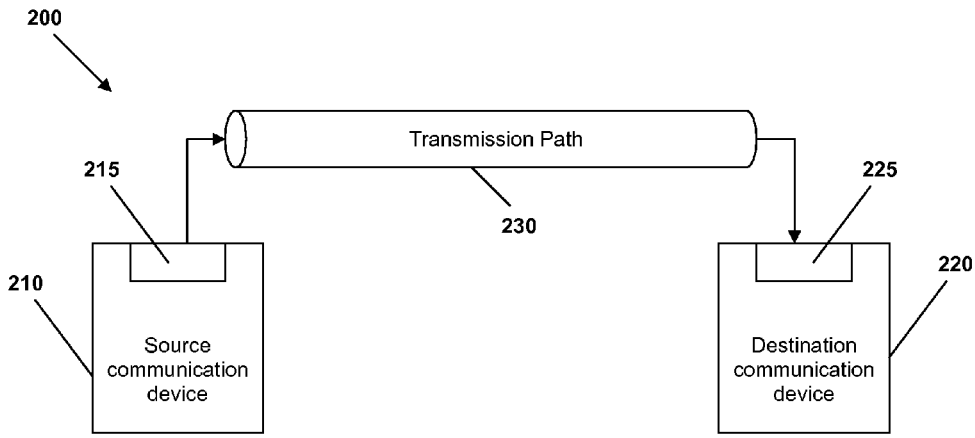
FIG. 2 illustrates a communication system comprising a source communication device arranged to transmit data signals to a destination communication device via a transmission path, according to embodiments of the invention.

Referring now to FIG. 2, there is illustrated a communication system 100 comprising a source communication device 210 arranged to transmit data signals to a destination communication device 220 via a transmission path 230. The source communication device 210 comprises encoding logic 215 for encoding data to be transmitted. For example, data to be transmitted may be encapsulated within MPEG-2 transport packets, which are then in turn encoded in accordance with a Digital Video Broadcasting (DVB) standard, such as the terrestrial DVB standard (DVB-T) (ETSI EN 300 744) or the handset DVB standard (DVB-H) (ETSI EN 302 304).

The transmission path 230 may comprise a variety of different mediums, for example wired communication links, optical communication links, wireless (RF) communication links, satellite links, etc.

The destination communication device 220 comprises decoder 225 for decoding data received. In accordance with embodiments of the invention, the decoder 225 is arranged to receive an encoded data signal and perform decoding on the encoded data signal to produce a decoded data signal. The decoder 225 is further arranged to predict a value for each of at least one header bit within the decoded data signal, and to apply the predicted value for each of the at least one header bit(s) during the convolutional decoding.

Figure 3:
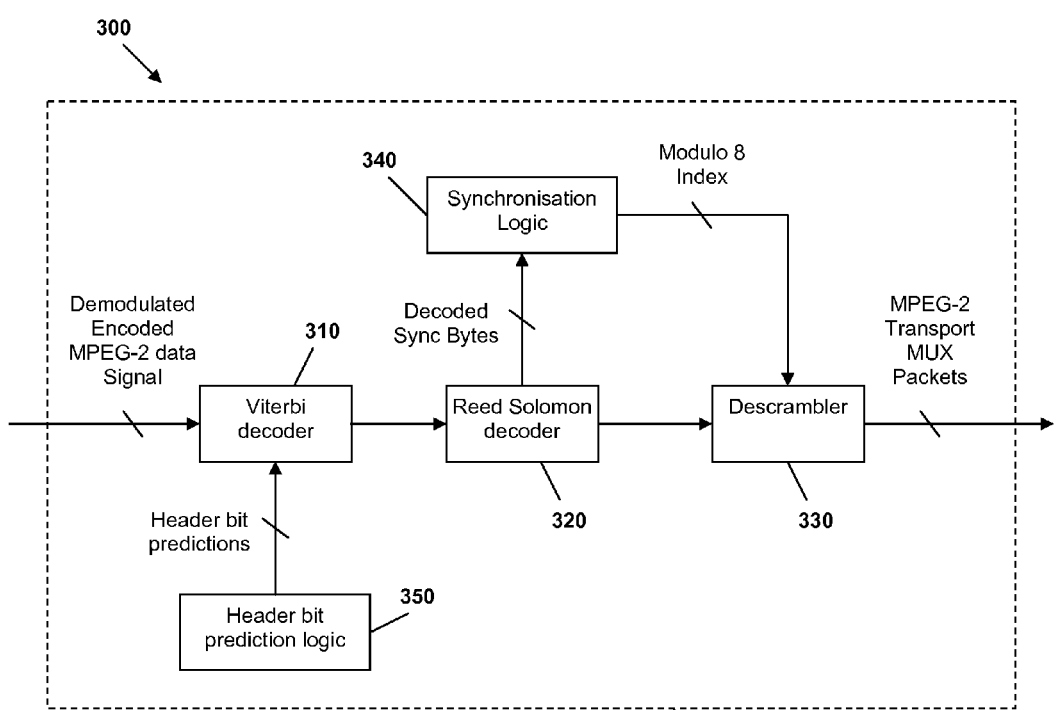
FIG. 3 illustrates part of decoder for decoding received data signals according to embodiments of the invention.

Referring now to FIG. 3, there is illustrated part of decoder 300 for decoding received data signals according to some embodiments of the invention, such as the decoder 225 of the destination communication device 220 of FIG. 2. For the illustrated embodiment, the decoder 300 is provided within a semiconductor device, such as integrated circuit 305. The decoder 300 comprises an inner decoder in a form of a convolutional decoder, which, for the illustrated embodiment, is implemented using a soft-decision Viterbi decoder 310. This arrangement may reduce an effect of thermal noise and interference on the quality of the received signal, as Viterbi errors are generally bursty in nature. For the illustrated embodiment, the Viterbi decoder 310 receives an encoded MPEG-2 data signal from a demodulator (not shown), and performs convolutional decoding thereon.

For the illustrated embodiment, the decoder 300 further comprises an outer decoder, in a form of a Reed Solomon decoder 320, which performs further decoding and error correction on the received data signal, and feeds the decoded signal into a descrambler 330. The descrambler 330 descrambles the received data packets, which are then output, for the illustrated embodiment, in a form of MPEG-2 transport multiplex (MUX) packets.

As previously mentioned, for data encoded in accordance with DVB standards, transmitted data is randomised, or scrambled, in order to ensure adequate binary transitions for the purpose of energy dispersal. A pseudo random binary sequence (PRBS) is used to scramble the data packets. A sync byte is then added to the front of each scrambled packet. The sync byte of the first packet in each group of eight packets is bit wise inverted to provide an initialisation signal for the descrambler. In this manner, each time a packet comprising an inverted sync byte is received, typically every $8^{th}$ packet in a stream, the descrambler reinitialises the PRBS.

Accordingly, for the illustrated embodiment, after decoding the received data, the Reed Solomon decoder 320 also passes decoded sync bytes to synchronisation logic 340. Synchronisation logic 340 is arranged to detect inverted sync bytes, and signals the descrambler 330 when to initialise the PRBS, for example by way of a modulo 8 index signal. The MPEG-2 transport MUX packets are then passed to a de-multiplexer (not shown), which de-multiplexes each MPEG-2 transport MUX packet, to separate out the individual services encapsulated therein.

In accordance with embodiments of the invention, the decoder 300 further comprises header bit prediction logic 350. The header bit prediction logic 350 is arranged to predict a value for each of at least one header bit within the decoded data signal, and to provide the predicted value for each of the at least one header bit(s) to, for the illustrated embodiment, the Viterbi decoder 310 for application of the predicted value for each of the at least one header bit(s) during the convolutional decoding.

Figure 4:
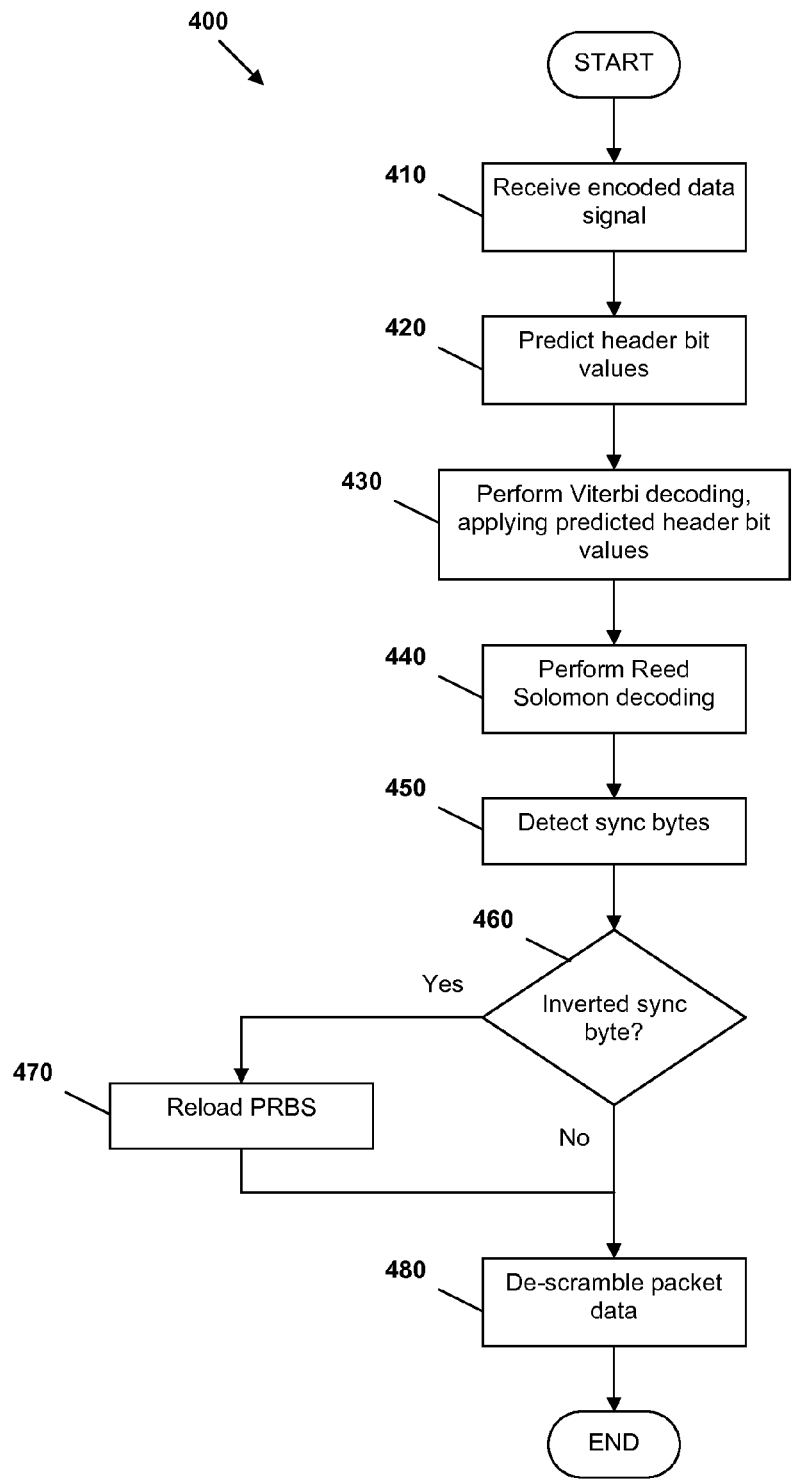
FIG. 4 illustrates a flow chart of a method for decoding a received data signal in accordance with embodiments of the invention.

Referring now to FIG. 4, there is illustrated a flow chart 400 of a method for decoding a received data signal in accordance with some embodiments of the invention.

The method starts and moves to step 410 with a receipt of an encoded data signal, such as an encoded MPEG-2 data signal. A value for each of at least one header bit within the decoded data signal is then predicted, in step 420. Next, in step 430, convolutional decoding, which for the illustrated embodiment comprises Viterbi decoding, is performed on the received encoded data signal, with the predicted value for each of the at least one header bit(s) applied during the convolutional decoding.

For the illustrated embodiment, further decoding and error correction, which for the illustrated embodiment is in a form of Reed Solomon decoding, is then performed on the received signal, in step 440, and sync bytes are then detected in step 450. Next, in step 460, it is determined whether the detected sync byte is inverted. If an inverted sync byte is detected, in step 460, the method moves to step 470, where the PRBS is reloaded in order to reinitialise the descrambling of data. The method then moves to step 480, where packet data is descrambled.

Referring now to FIG. 5, there are illustrated typical fields within the header section of an MPEG-2 transport stream data packet. The table comprises in the first column the field names, and in the second column the number of bits for each field. The third column comprises typical values for the various fields.

The 'sync_byte' field is a fixed 8-bit field. Accordingly, each bit of this field is predictable.

The 'transport_error_indicator' (TEI) is a 1-bit flag, which when set to '1' indicates that at least one un-correctable bit error exists in the associated transport stream packet. In most cases, it is reasonable to assume that a source communication device, from where the transport stream packet originated, transmits valid information, and therefore sets the TEI bit flag to '0'. Accordingly, this flag may be assumed to be set to '0', and is therefore also predictable, according to embodiments of the invention.

The 'payload_unit_start_indicator' is a 1-bit flag, which has normative meaning for transport stream packets that carry Packet Elementary Stream (PES) packets or Payload Start Indicator (PSI) data. The flag is set to '1' to indicate that the payload of the associated transport stream packet will commence with the first byte of the PES packet, and a '0' indicates that no PES packet shall start in this transport stream packet.

The 'transport_priority' is a 1-bit indicator that, when set to '1', indicates that the associated transport packet is of greater priority than other packets having the same Packet IDentification (PID) that do not have their 'transport_priority' bit set to '1'. This flag is not commonly used, and is most frequently set to '0'. As such, the transport priority bit may be assumed to be set to '0', and is therefore also predictable.

The PID is a 13-bit field that indicates the type of data stored in the packet payload.

The 'transport_scrambling_control' is a 2-bit field indicating the scrambling mode of the transport packet payload.

The 'adaptation_field_control' is a 2-bit field indicating whether the associated transport packet header is followed by an adaptation field and/or payload.

Statistical analysis of settings of 'adaptation_field_control' fields and 'transport_scrambling_control' fields for packets may allow the setting for this field to be predicted, as described in more detail below.

The 'continuity_counter' is a 4-bit field incrementing with each TS packet having the same PID.

From the above, it can be seen that the bit values for each of the 'sync_byte', 'transport_error_indicator' and 'transport_priority' fields may be predicted. Accordingly, the predicted values for these header bits may be applied during the convolutional decoding. In this manner, erroneous values that may have occurred for these header bits may be corrected. Thus, the decoded header bits of a received data signal may be less likely to comprise errors, and therefore, in the case of MPEG-2 transport MUX packets for example, data packets may be less likely to be discarded due to errors within their header sections.

Furthermore, due to the characteristics of convolutional decoding, by applying the selection of correct values for these header bits, the selection of correct values for bits in the vicinity of the predicted bits within the convolutional code sequence is also improved. In this manner, not only does the prediction of header bit values improve the decoding of those header bits, but can also improve the decoding of other bits within the received data stream.

As previously mentioned, for data encoded in accordance with DVB standards, transmitted data is randomised, or scrambled, in order to ensure adequate binary transitions for the purpose of energy dispersal. A pseudo random binary sequence (PRBS) is used to scramble the data packets. The sync byte is then added to the front of each scrambled packet. The sync byte of the first packet in each group of eight packets is bit wise inverted to provide an initialisation signal for the descrambler. Accordingly, although the sync byte value is a set value (0x47), applying a selection of values for the sync byte bits to those of the set value will result in the inverted values for every eighth packet to be reset to the un-inverted values. Consequently, the descrambler will receive no initialisation signal, and as such the PRBS of the descrambler will lose synchronisation with that of the scrambler of the transmitter.

Nevertheless, the sync byte values are still predictable since, in the same way as the descrambler is informed when to reinitialise the PRBS based on a received inverted sync byte. The header bit prediction logic may be informed when an inverted sync byte has been received, and thereby predict when the next inverted sync byte will be received (i.e. eight packets later).

In addition to the 'sync_byte', 'transport_error_indicator' and 'transport_priority' fields, the 'transport_scrambling_control' and 'adaptation_field_control' fields may also be predicted with statistical analysis, since their values within a particular transport stream tend to be consistent.

An MPEG-2 TS header comprises 32 bits. Starting with a 32 bit comparison string, initialised such that each bit comprises a '1' value, by performing a bit wise AND comparison with each received header, updating the comparison string with the result, a statistical trend of those bits that can be predicted to comprise a '1' is obtained.

For example, using a 10-bit string as an illustration, a comparison string is initialised to comprise all '1' bit values: '11111 11111'. A header section is received comprising bit values of: '01010 11100'. An AND comparison is then carried out between the comparison string and the header section:

'11111 11111' AND '01010 11100'='01010 11100'

The comparison string is then updated with the result. As can be seen, after the first comparison, the result is equal to the first header section. A second header section is then received comprising bit values of: '11101 11001', and the comparison is repeated:

'01010 11100' AND '11101 11001'='01000 11000'

A third header section is then received comprising bit values of '11011 11101', and the comparison is again repeated:

'01000 11000' AND '11011 11101'='01000 11000'

As can be seen, the second, sixth and seventh bits are set to '1', indicating that the corresponding bits in the received header sections have always been set to '1'.

Simultaneously, a similar comparison may be carried out to determine those bits that are always set to '0', by inverting the header bit values, and performing an AND comparison in a similar manner to that above.

For example, using a 10-bit string as an illustration, a comparison string (separate to that used for determining those bits always set to '1') is initialised to comprise all '1' bit values: '11111 11111'. A header section is received comprising bit values of: '01010 11100'. The header section is inverted bit wise: '10101 00011', and an AND comparison is then carried out between the comparison string and the inverted header section:

'11111 11111' AND '10101 00011'='10101 00011'

The comparison string is then updated with the result. As can be seen, after the first comparison, the result is equal to the first inverted header section. A second header section is then received comprising bit values of: '11101 11001'. The header section is inverted bit wise: '00010 00110' and the comparison is repeated:

'10101 00011' AND '00010 00110'='00000 00010'

A third header section is then received comprising bit values of '11011 11101'. The header section is inverted bit wise: '00100 00010' and the comparison is again repeated:

'00000 00010' AND '00100 00010'='00000 00010'

As can be seen, the ninth bit is set to '1', indicating that the ninth bit in the received header sections has always been set to '0'.

Such statistical analysis of received header bit information enables header bits, such as those relating to the 'transport_scrambling_control' and 'adaptation_field_control' fields, to be predicted based on previously received header bit information.

Figure 6:
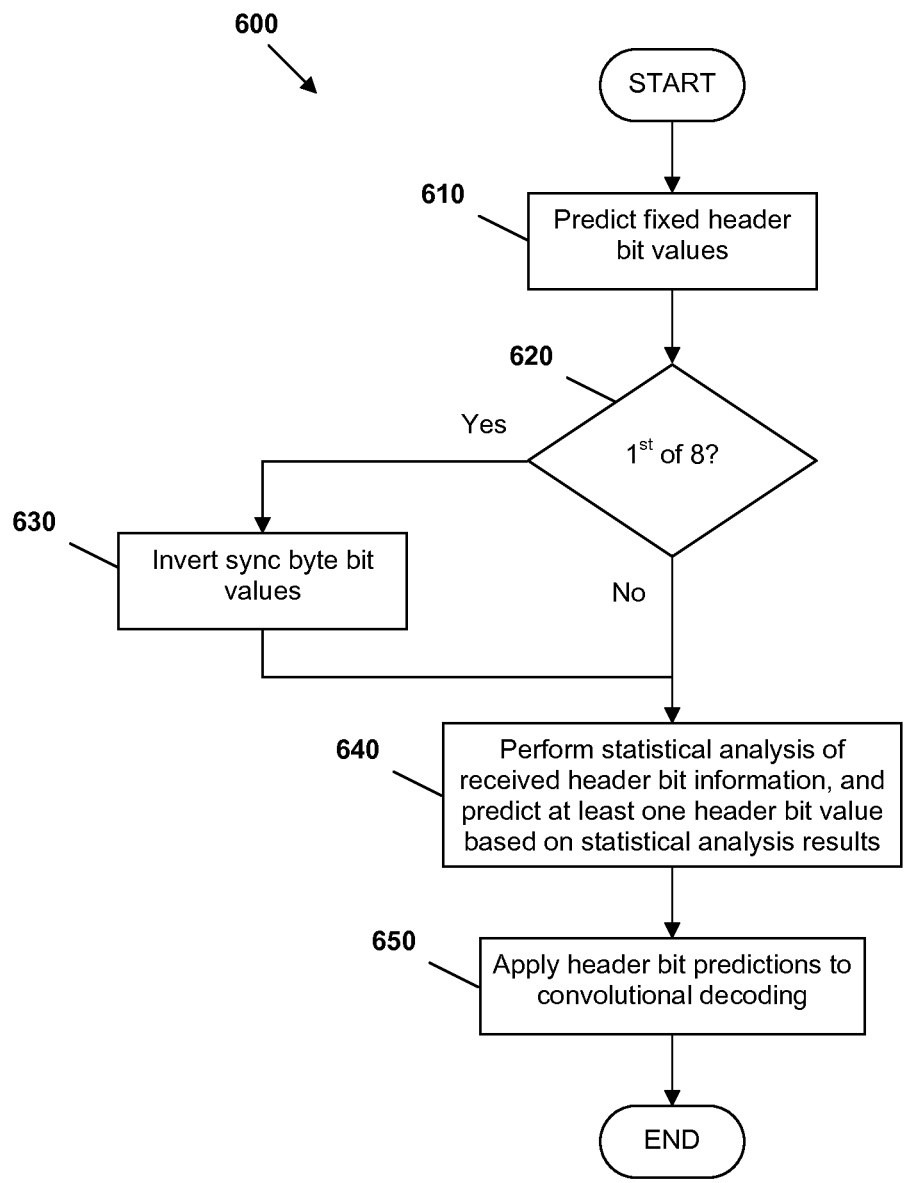
FIG. 6 illustrates a flow chart of a method of predicting a value for each of at least one header bit within a decoded data signal according to an embodiment of the invention.

Referring now to FIG. 6, there is illustrated a flowchart 600 of a method of predicting a value for each of at least one header bit within a decoded data signal, according to an embodiment of the invention. The method starts and moves to step 610 with the prediction of fixed header bit values. For example, in a case of an MPEG-2 transport stream data packet, fixed header bit values may relate to 'sync_byte', 'transport_error_indicator' and 'transport_priority' fields.

Next, for the illustrated embodiment, in step 620, the method comprises a step of determining whether the header bits being predicted comprise an inverted sync byte. This is achieved by determining whether the header bits being predicted relate to the first packet in a group of eight packets. For example, in a case of an MPEG-2 transport stream data packet, although the sync byte comprises a fixed value, the value is inverted bit wise for the first packet in each group of eight packets.

If it is determined that the header bits being predicted relate to the first packet in a group of eight packets, the method moves to step 630 where the bit value predictions for the sync byte are inverted. The method then moves to step 640. Referring back to step 620, if it is determined that the header bits being predicted do not relate to the first packet in a group of eight packets, the method moves directly to step 640.

In step 640, statistical analysis of received header bit information is performed, and at least one header bit value is predicted based on the statistical analysis results. In this manner, statistically predictable header bits may be identified. For example, in a case of an MPEG-2 transport stream data packet, statistically predictable header bits may relate to the 'transport_scrambling_control' and 'adaptation_field_control' fields. The method then moves to step 650, where the header bit predictions (both fixed and statistically predictable header bit predictions) are applied during convolutional decoding. The method then ends.

Figure 7:
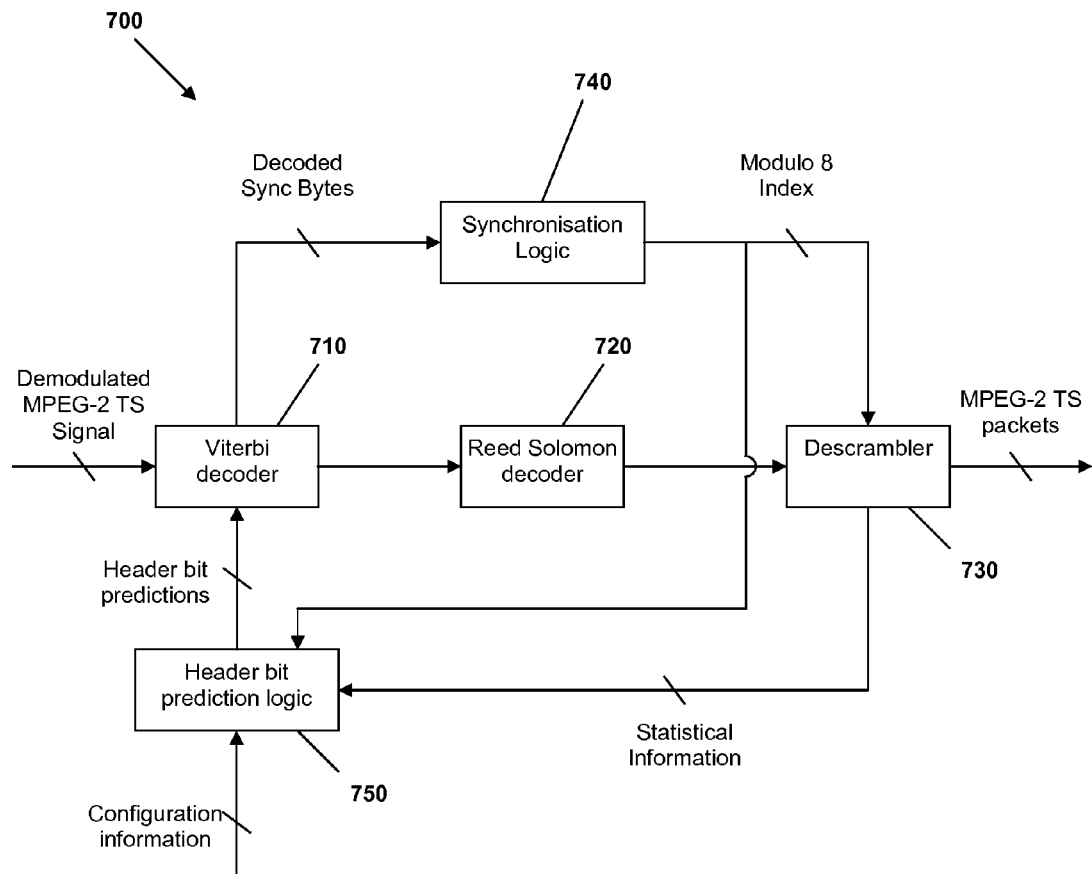
FIG. 7 illustrates part of a decoder for decoding received data signals according to an alternative embodiment of the invention.

Referring now to FIG. 7, there is illustrated part of decoder 700 for decoding received data signals according to an alternative embodiment of the invention. The decoder 700 comprises an inner decoder in a form of a convolutional decoder, which, for the illustrated embodiment, is implemented using a soft-decision Viterbi decoder 710. The decoder 700 further comprises an outer decoder, in a form of a Reed-Solomon decoder 720, which performs further decoding on a received data signal, and feeds the decoded signal into a descrambler 730. The descrambler 730 descrambles the received data packets, which are then output, for the illustrated embodiment, in a form of MPEG-2 transport multiplex (MUX) packets. The MPEG-2 transport MUX packets are then passed to a de-multiplexer (not shown), which de-multiplexes each MPEG-2 transport MUX packet, to separate out the individual services encapsulated therein.

The decoder 700 further comprises header bit prediction logic 750, which is arranged to predict a value for each of at least one header bit within the decoded data signal, and to provide the predicted value for each of the at least one header bit(s) to, for the illustrated embodiment, the Viterbi decoder 710. The viterbi decoder 710 applies the predicted value for each of the at least one header bit(s) during the convolutional decoding. For example, the header bit prediction logic 750 may be arranged to predict generally fixed header bit values, such as 'sync bytes values', 'transport_error_indicator' field values, and 'transport_priority' field values.

The header bit prediction logic 750 is further arranged to receive signals from the synchronisation logic 740 regarding detection of inverted sync bytes. In this manner, since the sync byte value is conditional on whether the header section is associated with the first packet in a block of eight packets, and thereby whether the sync value is inverted, the header bit prediction logic 750 is able to predict when sync byte values should be inverted.

The header bit prediction logic 750 is further arranged to receive statistical information from, for the illustrated embodiment, the descrambler 730. For example, the statistical information may comprise information relating to values for header bits within a received signal. In this manner, the header bit prediction logic 750 may perform statistical analysis, such as described above. Such statistical analysis of received header sections enables header bits, such as those relating to the 'transport_scrambling_control' and 'adaptation_field_control' fields, to be predicted based on previously received header section information.

In one embodiment, the statistical information provided by the descrambler 730 only relates to values for header bits within a received signal for which no errors were detected, for example during the Reed-Solomon decoding. In this manner, erroneous statistical data may substantially be prevented from corrupting the statistical analysis. In an alternative embodiment, the descrambler 730 may provide statistical information for all relevant header bits, and also provide information identifying whether errors were detected. In this manner, the header bit prediction logic 750 may determine, based on the information identifying whether errors were detected, whether statistical information relating to particular header bits should be used in the statistical analysis.

As will be appreciated by a skilled artisan, it may be the case that a header bit value, having remained constant at, say '1' over numerous received header sections, may at a later stage change value to, say, '0'. Accordingly, since the header bit value previously remained constant at '1', the statistical analysis may cause the header bit prediction logic to force the convolution decoder to erroneously set the header bit value to the previously constant value of '1'. In this manner, errors may be 'forced' into the header section. However, for the illustrated embodiments, the Reed Solomon decoder is able to correct up to sixteen bytes, and therefore is likely to detect and correct this forced error within the header section.

However, in an alternative embodiment of the invention, it is contemplated that a received data signal may be initially decoded without any header bit prediction being performed. In this manner, if a header bit value changes, the change in value will not be affected by header bit prediction. Only if errors are detected within the (non-predicted) decoded header section of the received data signal will the received encoded data signal be (re)decoded with header bit prediction being performed.

For the embodiment illustrated in FIG. 7, the prediction logic 750 is further arranged to receive configuration information. For example, the window of statistics may be limited to a duration of a few hundreds packets. This may be implemented by resetting the statistics periodically based on a configurable window setting. Alternatively, the configuration of the statistical window may be influenced by the block error rate measured by the Read Solomon decoding.

Furthermore, since the header bit values for the sync byte are predicted by the header bit prediction logic 750, it is not necessary to wait for the Reed Solomon decoder 720 to further decode the received signal in order to obtain the sync byte. Accordingly, for the embodiment illustrated in FIG. 7, the Viterbi decoder 710 passes the predicted sync byte to synchronisation logic 740, which detects inverted sync bytes, and signals the descrambler 730 when to initialise the PRBS, for example by way of a modulo 8 index signal. Alternatively, the header bit prediction logic 750 may pass the predicted sync byte to synchronisation logic 740. In this manner, the synchronisation logic 740 receives the sync bytes earlier, enabling the synchronisation logic 740 to be simplified. Furthermore, the synchronisation becomes more robust since it is not dependent on the further decoding carried out by the Reed Solomon decoder 720.

For the various embodiments illustrated and described above, the prediction logic has been illustrated and described as a discrete functional element for ease of understanding. However, as will be appreciated by a skilled artisan, the prediction logic may be integrated, either as a whole or in part, within the convolutional decoder.

It will be understood that the method and apparatus for decoding received data signals, as described above, aim to provide at least one or more of the following:
  Decoded header bits of a received data signal are less likely to comprise errors;
  Data packets are less likely to be discarded due to errors contained within their header sections; and
  Compatibility with existing standards is maintained.

In particular, it is envisaged that the aforementioned embodiments be applied by a semiconductor manufacturer to any integrated circuit architecture supporting an improved method and apparatus for decoding received data signals. It is further envisaged that, for example, a semiconductor manufacturer may employ the embodiments in a design of a stand-alone device, or application-specific integrated circuit (ASIC) and/or any other sub-system element employing an integrated circuit to support an improved method and apparatus for decoding received data signals.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few. Such computer readable media may be permanently, removably or remotely coupled to an information processing system such as system 10

It will be appreciated that any suitable distribution of functionality between different functional units or controllers or memory elements, may be used without detracting from the embodiments herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although embodiments of the invention have been described in connection with MPEG 2 embodiments, it is not intended to be limited to the specific form set forth herein. Rather, the scope of the invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second' etc. do not preclude a plurality.

The invention claimed is:
1. Decoding logic comprising:
  a convolutional decoder arranged to receive an encoded data signal and perform convolutional decoding on the encoded data signal to produce a decoded data signal;
  a descrambler for descrambling decoded data packets according to a descrambling sequence; and header bit prediction logic arranged to determine whether the decoded digital signal comprises an inverted synchronization byte, and in response thereto:
predict a value for at least one header bit within the decoded data signal based on statistical analysis of header bit information of previously received encoded data signals;
provide the predicted value for the at least one header bit to the convolutional decoder to be applied during initial convolutional decoding of the encoded data signal;
predict a value for a second header bit based on statistical analysis of header bit information of previously received encoded data signals; and
provide the predicted value for the second header bit to the convolutional decoder to be applied during convolutional decoding, the statistical analysis restricted to statistical analysis of values for headers bits within the header bit information for which no errors are detected.

2. The decoding logic of claim 1 wherein the header bit prediction logic is arranged to predict at least one fixed header bit value.

3. The decoding logic of claim 2 wherein the predicted at least one fixed header bit value comprises at least one of the following fields: synchronization byte;
transport error indicator; transport priority.

4. The decoding logic of claim 2 wherein the header bit prediction logic is further arranged to predict at least one header bit value based on statistical analysis of received header bit information.

5. The decoding logic of claim 1 wherein the statistical analysis of received header bit information comprises performing a bit wise AND comparison of the received header bit information with a comparison string.

6. The decoding logic of claim 5 wherein the at least one header bit value predicted based on statistical analysis comprise at least one of: transport scrambling control; and adaptation field control fields.

7. The decoding logic of claim 1 wherein the at least one header bit value predicted based on statistical analysis comprise at least one of: transport scrambling control; and adaptation field control fields.

8. The decoding logic of claim 7 wherein the descrambler uses a pseudo random binary sequence to descramble the received data packets.

9. The decoding logic of claim 1 further characterised in that the decoding logic further comprises an outer decoder for performing further decoding and error correction on the received data signal.

10. The decoding logic of claim 9 further characterised in that the outer decoder comprises a Reed Solomon decoder.

11. The decoding logic of claim 1 wherein the received encoded data signal comprises an encoded MPEG-2 data signal.

12. The decoding logic of claim 1 wherein the header bit prediction logic is further arranged to predict a value for a third header bit based on statistical analysis of received header bit information and based upon received configuration information on gathering statistical information about header bits, and to provide the predicted value for the third header bit to the convolutional decoder to be applied during convolutional decoding.

13. The decoding logic of claim 1 further comprising a synchronization logic to receive decoded synchronization bytes, the receiving before the descrambling, and to transmit signals to the header bit prediction logic regarding detection of inverted synchronization bytes.

14. A method for decoding a received data signal comprising:
receiving an encoded data signal;
performing at least convolutional decoding on the encoded data signal to produce a decoded data signal;
descrambling decoded data packets according to a descrambling sequence;
determining whether the decoded data signal comprises an inverted synchronization byte; and
in response thereto:
predicting a value for at least one header bit within the decoded data signal based on statistical analysis of header bit information of previously received encoded data signals;
applying the predicted value for the at least one header bit during initial convolutional decoding of the encoded data signal;
predicting a value for a second header bit based on statistical analysis of header bit information of previously received encoded data signals; and
providing the predicted value for the second header bit to the convolutional decoder to be applied during convolutional decoding, the statistical analysis restricted to statistical analysis of values for headers bits within the header bit information for which no errors are detected.

15. The method of claim 14, wherein the received encoded data signal comprises an encoded MPEG-2 data signal.

16. A semiconductor device comprising:
decoding logic, arranged to receive an encoded data signal, wherein the decoding logic comprises:
a convolutional decoder arranged to perform convolutional decoding on the encoded data signal to produce a decoded data signal;
a descrambler for descrambling decoded data packets according to a descrambling sequence; and
header bit prediction logic arranged to predict a value for a header bit based on statistical analysis of header bit information of previously received encoded data signals, the statistical analysis configurable based upon received configuration information about gathering the header bit information, and to provide the predicted value for the header bit to the convolutional decoder to be applied during convolutional decoding.

17. The semiconductor device of claim 16, wherein the configuration information specifies a size of a window for collecting information used for the statistical analysis, the size of the window measured by a number of packets.

18. The semiconductor device of claim 16, wherein the configuration information specifies a window for collecting information used for the statistical analysis, the size of the window based upon a block error rate.

* * * * *